United States Patent [19]
Wong et al.

[11] Patent Number: 5,969,986
[45] Date of Patent: Oct. 19, 1999

[54] HIGH-BANDWIDTH READ AND WRITE ARCHITECTURES FOR NON-VOLATILE MEMORIES

[75] Inventors: Sau C. Wong, Hillsborough; Hock C. So, Redwood City, both of Calif.

[73] Assignee: Invox Technology, Campbell, Calif.

[21] Appl. No.: 09/103,623

[22] Filed: Jun. 23, 1998

[51] Int. Cl.$^6$ .................................................. G11C 16/04
[52] U.S. Cl. .............................. 365/185.03; 365/185.11; 365/185.19; 365/185.21; 365/185.33
[58] Field of Search ....................... 365/185.03, 185.11, 365/185.19, 185.21, 185.33

[56] References Cited

U.S. PATENT DOCUMENTS

| | | | |
|---|---|---|---|
| 4,054,864 | 10/1977 | Audaire et al. | 365/185.03 |
| 4,057,788 | 11/1977 | Sage | 365/174 |
| 4,181,980 | 1/1980 | McCoy | 365/45 |
| 4,200,841 | 4/1980 | Nagata et al. | 455/169 |
| 4,318,188 | 3/1982 | Hoffmann | 365/45 |
| 4,627,027 | 12/1986 | Rai et al. | 365/45 |
| 4,809,223 | 2/1989 | Brown | 365/45 |
| 4,852,063 | 7/1989 | McNutt | 365/185.03 |
| 4,890,259 | 12/1989 | Simko | 365/45 |
| 4,935,702 | 6/1990 | Mead et al. | 330/9 |
| 4,989,179 | 1/1991 | Simko | 365/45 |
| 5,028,810 | 7/1991 | Castro et al. | 365/185.03 |
| 5,055,897 | 10/1991 | Canepa et al. | 257/319 |
| 5,126,967 | 6/1992 | Simko | 365/45 |
| 5,163,021 | 11/1992 | Mehrotra | 365/185.03 |
| 5,164,915 | 11/1992 | Blyth | 365/45 |
| 5,168,465 | 12/1992 | Harari | 257/320 |
| 5,172,338 | 12/1992 | Mehrotra et al. | 365/185.03 |
| 5,218,569 | 6/1993 | Banks | 365/189.01 |
| 5,220,531 | 6/1993 | Blyth et al. | 365/189.07 |
| 5,239,500 | 8/1993 | Oguey | 365/45 |
| 5,241,494 | 8/1993 | Blyth et al. | 365/45 |
| 5,243,239 | 9/1993 | Khan et al. | 327/553 |
| 5,262,984 | 11/1993 | Noguchi et al. | 365/185.03 |
| 5,272,669 | 12/1993 | Samachisa et al. | 365/185.03 |
| 5,294,819 | 3/1994 | Simko | 257/314 |
| 5,339,270 | 8/1994 | Jiang | 365/185.03 |
| 5,394,362 | 2/1995 | Banks | 365/189.01 |
| 5,430,670 | 7/1995 | Rosenthal | 365/45 |
| 5,680,341 | 10/1997 | Wong et al. | 365/45 |
| 5,748,533 | 5/1998 | Dunlap et al. | 365/185.03 |
| 5,815,425 | 9/1998 | Wong et al. | 365/185.03 |
| 5,847,991 | 12/1998 | Tong et al. | 365/185.03 |

OTHER PUBLICATIONS

Chen et al., "Subbreakdown Drain Leakage Current in MOSFET", IEEE, 1987, pp. 515–517.

(List continued on next page.)

*Primary Examiner*—Trong Phan
*Attorney, Agent, or Firm*—Skjerven, Morrill & Friel MacPherson, Franklin & Friel LLP; David T. Millers

[57] ABSTRACT

A memory architecture for a non-volatile analog or multiple-bits-per-cell memory includes multiple separate memory arrays and multiple read/write pipelines. The multiple read/write pipelines share a read circuit and/or a write circuit to reduce the circuit area of each pipeline and the circuit area of the memory as a whole. In one embodiment, a shared write circuit generates a programming voltage that changes with an input signal representing values to be written to the memory. Each pipeline includes a sample-and-hold circuit that samples the programming voltage when the pipeline begins a write operation. The write circuit can additionally generate a verify voltage that a second sample-and-hold circuit in each pipeline samples when starting a write operation. In another embodiment, a shared read circuit generates a read signal that ramps across the range of permitted threshold voltages for the memory cells, and a sense amplifier in each pipeline clocks a sample-and-hold circuit or another temporary storage circuit when the sense amplifier senses a transition in conductivity of a selected memory cell. When clocked, the sample-and-hold circuit or other temporary storage circuit registers a signal that corresponds to the read signal and indicates a data value associated with the voltage of the read signal. In alternative embodiments, the signal registered is the read signal, a converted form of the read signal, or a multi-bit digital signal.

25 Claims, 7 Drawing Sheets

OTHER PUBLICATIONS

Dov Frohman–Bentchkowsky, "A Fully Decoded 2048–Bit Electrically Programmable FAMOS Read–Only Memory" (reprinted from IEEE J. Solid–State Circuits, vol. SC–6, #5, Oct. 1971, pp. 301–306) pp. 63–68.

Lenziner et al., "Fowler–Nordheim Tunneling into Thermally Grown $SiO_2$", Journal of Applied Physics, vol. 40, No. 1, Jan. 1969, pp. 278–283.

Press Release: Intel Announces Multilevel Cell Flash Technology, Intel Corporation, 1994, 3 pages.

"Solutions OEM," A Publication of Intel Corporation, vol. 2, No. 2, (Autumn) Sep., 1994, pp. 1–8.

Ajika et al., "A 5 Volt Only 16M BIT Flash EEPROM Cell With A Simple Stacked Gate Structure", (Reprinted from IEDM Tech. Dig., 1990, pp. 115–118), LSI R & D Lab., Paper 5.11, pp. 209–212.

Haddad et al., "Degradations Due To Hole trapping in Flash Memory Cells", 1989, IEEE Electron Device Lett., vol. 10, No. 3, pp. 117–119.

Hoe et al., "Cell and Circuit Design for Single–Poly EPROM", 1989, IEEE Journal of Solid–State Circuits, vol. 24, No. 4, pp. 1153–1157.

Johnson et al., "A 16Kb Electrically Erasable Nonvolatile Memory", IEEE ISSCC, Dig. Tech. pap. 1980, pp. 125–127.

Kamiya et al, "EPROM Cell With High Gate Injection Efficiency", IEDM Tech. Dig. 1982 (reprint) pp. 741–744.

Kazerounian et al., "A 5 Volt High Density Poly–Poly Erase Flash EPROM Cell", IEDM Tech. Dig., 1988 (reprint) pp. 202–205.

Kynett et al., "An In–System Reprogrammable 32Kx8 CMOS Flash Memory", IEEE J. Solid–State Circuits, vol. 23, No. 5, Oct. 1988 (reprint), pp. 170–175.

Naruke et al., "A New Flash–Erase EEPROM Cell With a Sidewall Select–Gate On Its Source Side", IEDM Tech. Dig., 1989 (reprint) pp. 183–186.

Perlegos et al., "A 64K EPROM Using Scaled MOS Technology", IEEE ISSCC Dig. Tech. Pap., 1980 (reprint) pp. 69–71.

Wu et al., "A Novel High–Speed, 5 Volt programming EPROM Structure With Source–Side Injection", IEDM Tech. Dig., 1986 (reprint) pp. 108–111.

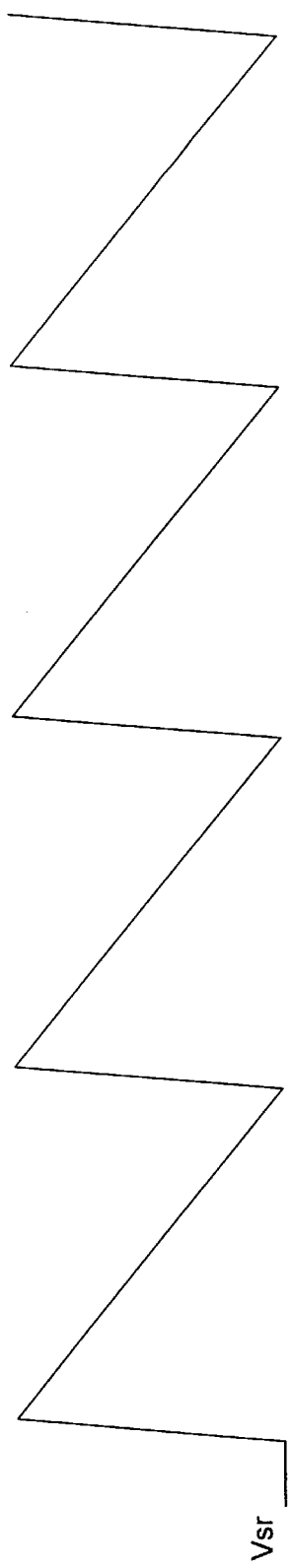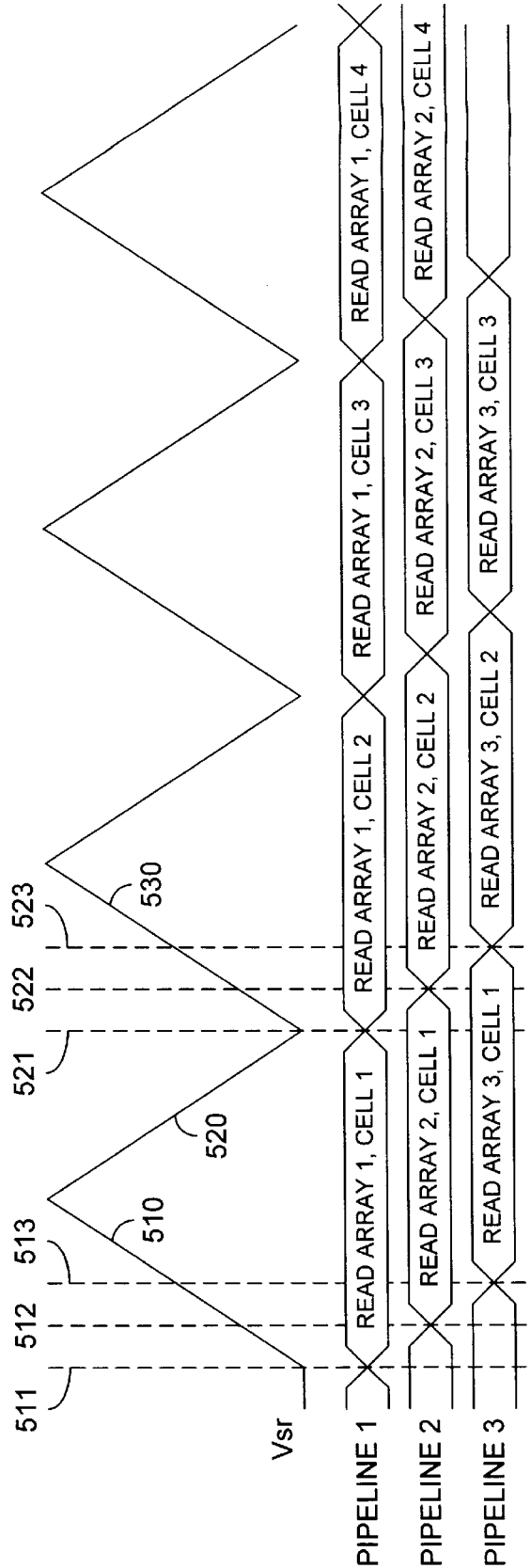

HIGH-BANDWIDTH READ AND WRITE ARCHITECTURES FOR NON-VOLATILE MEMORIES

BACKGROUND

1. Field of the Invention

This invention relates to non-volatile semiconductor memories such as EPROM, EEPROM, and flash memory, and more particularly to memory architectures that provide high data transfer rates.

2. Description of Related Art

Semiconductor non-volatile memories such as EPROM, EEPROM, and flash memories, which permit electrical programming and erasing of memory cells, are well known. Such memories conventionally include arrays of memory cells where each memory cell includes a floating gate transistor. Write and erase circuits coupled to an array change the threshold voltages of floating gate transistors by electrically charging or discharging the floating gates of the transistors. In particular, to write to a memory cell, the write circuit charges the floating gate of the floating gate transistor in the memory cell until the threshold voltage of the transistor is at a level that representing the value being written. The read circuit senses the threshold voltage of a floating gate transistor in a memory cell to determine the value stored in the cell.

In different applications, the threshold voltage of a floating gate transistor can represent a single bit, multiple bits, or an analog value. For conventional binary (i.e., single-bit-per-cell) non-volatile memories, threshold voltages below a break-point level represent one binary value (0 or 1), and threshold voltages above the break-point level represent the other binary value (1 or 0). Accordingly, erase and write circuits in a binary memory set the threshold voltages of every memory cell at either a high level or a low level, and the read circuit can easily distinguish between the levels. Threshold voltages of memory cells in multiple-bits-per-cell memories or analog memories respectively have several (4, 8, 16, or more) distinct threshold voltage bands or a continuous range of levels. Accordingly, multiple-bits-per-cell memories and analog memories need precise control when writing threshold voltages and high accuracy when identifying threshold voltages. The write and read circuits which achieve the precision and accuracy required for multiple-bits-per-cell and analog memories are typically slower than write and read circuits for binary memory. Accordingly, the read and write speeds of read and write circuits in multiple-bit-per-cell memory and analog memory are normally slower than their binary counterparts.

To improve read and write data rates (i.e., the bandwidth) for an analog memory, a memory system using a pair of buffers and multiple write circuits is known. The memory system sequentially collects data in a first buffer while writing in parallel, the data from a second buffer into a memory array. The buffers exchange roles when writing of the data from the second buffer is complete and the first buffer is full of data. Similarly, an analog memory can use a pair of buffers and a set of parallel read circuits to improve read rates. A disadvantage of such memories is increased costs associated with the increases in circuit complexity and integrated circuit area.

U.S. Pat. No. 5,680,341, entitled "Pipelined Record and Playback for Analog Non-Volatile Memory", to Wong. et al., which is hereby incorporated by reference in its entirety, describes memory systems using multiple read or write pipelines. A pipelined write architecture, for example, includes multiple write pipelines with each write pipeline including a sample-and-hold circuit and write circuitry for writing a value from the sample-and-hold circuit into a memory cell. Write pipelines are started sequentially as the sample-and-hold circuits acquire values to be written. By the time the last write pipeline in the sequence starts a write operation, first pipeline in the sequence has completed a previously started write operation and is ready to start another. Accordingly, a pipelined architecture can increase the write bandwidth in proportion to the number of write pipelines employed, without sacrificing accuracy or resolution. A pipeline read architecture can also be used to increase the read bandwidth. An advantage that the pipelined memory architecture has over the parallel read and write architecture is a reduction in required circuitry. In particular, the parallel architecture requires two sample-and-hold circuits (one in each buffer) per read or write circuit. The pipelined architecture requires only a single sample-and-hold circuit per read or write circuit. Thus, the pipelined architecture can reduce circuit cost by decreasing the required integrated circuit area.

Memory architectures which provide a high bandwidth for analog and multiple-bits-per-cell data flow but require even less circuit area are desired.

SUMMARY

In accordance with the invention, memory architecture for a non-volatile analog memory or a non-volatile multiple-bits-per-cell memory includes multiple independent memory arrays and multiple read/write pipelines. The multiple read/write pipelines share a read circuit and/or a write circuit to reduce the circuit area of each pipeline and the circuit area of the memory as a whole. In one embodiment, a shared write circuit generates a programming voltage that changes with an input signal representing values to be written to the memory. Each pipeline includes a sample-and-hold circuit that samples the programming voltage when the pipeline begins a write operation. The write circuit can additionally generate a verify voltage that a second sample-and-hold circuit in each pipeline samples when starting a write operation. The verify voltage identifies and target threshold voltage for a write operation. Each pipeline uses the programming voltage from its own sample-and-hold circuits when generating pulses that change the threshold of a selected memory cell and uses the verify voltage from its own sample-and-hold circuit in verify cycles that determine whether the target threshold voltage is reached and a write operation is complete.

In another embodiment, a shared read circuit generates a read signal that ramps across the range of permitted threshold voltages for the memory cells, and a sense amplifier in each pipeline clocks a sample-and-hold circuit or another temporary storage circuit such a flip-flop or latch in the pipeline when the sense amplifier senses a transition in conductivity of a selected memory cell. When clocked, the sample-and-hold circuit registers an analog signal that corresponds to the read signal and indicates a data value associated with the voltage of the read signal. In alternative embodiments, the signal registered is the read signal, a converted form of the read signal, or a multi-bit digital signal. When sampling the read signal, the registered voltage is equal to the threshold voltage of the selected memory cell. Sampling the converted form of the read signal can effectively map the threshold voltage directly to a data value. Sampling the multi-bit digital signal using a set of flip-flops or latches directly provides a multi-bit value read from a memory cell and does not require further analog to digital conversion. Alternatively, a multiple-bit-per-cell memory uses an analog read process (and an analog write process) but converts the output analog signals to digital form (and converts multi-bit digital input signals to analog form.)

BRIEF DESCRIPTION OF THE DRAWINGS

FIGS. 5A and 5B shows some alternative wave forms for a read signal used in read operations in accordance with alternative embodiments of the invention.

Use of the same reference symbols in different figures indicates similar or identical items.

DETAILED DESCRIPTION OF THE PREFERRED EMBODIMENTS

In accordance with an aspect of the invention, a memory architecture includes multiple memory arrays in multiple read/write pipelines. The multiple arrays provide high performance and high throughput for memory applications such as recording and playing back digital images and high-fidelity music. To reduce integrated circuit area for the memory and reduce power consumption, the memory includes an erase circuit, a write circuit, and a read circuit that all of the arrays share. This reduces integrated circuit area because each read/write pipeline no longer contains a complete and separate read circuit or write circuit. Power consumption is reduced because fewer read write circuits need to be powered or switched on and off, and peak programming current reduces by avoiding simultaneous starting of write operations.

Figure 1:
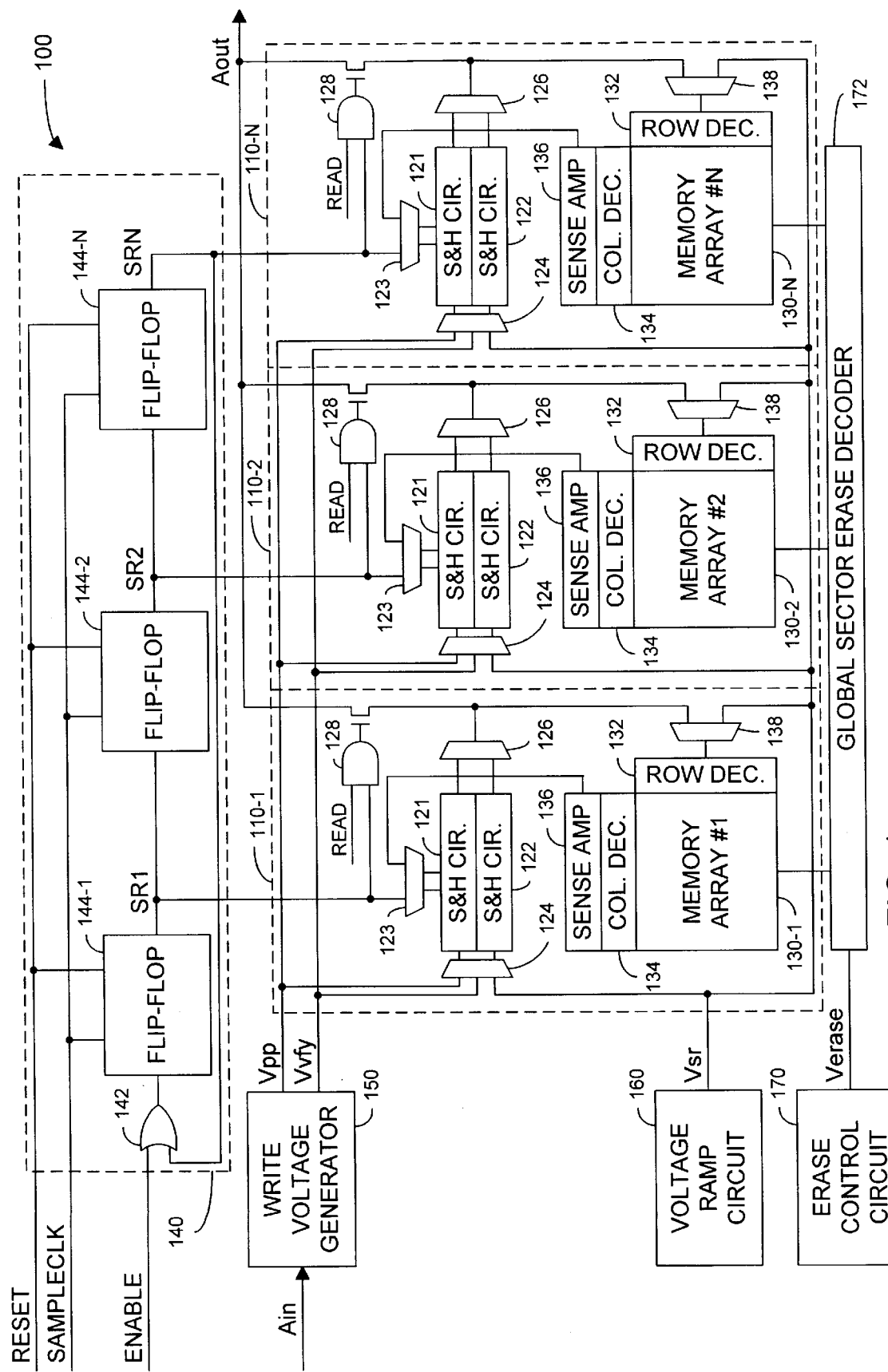
FIG. 1 is a block diagram of an analog memory in accordance with an embodiment of the invention.

FIG. 1 is a block diagram of a non-volatile analog memory 100 in accordance with an embodiment of the invention. Memory 100 includes multiple arrays 130-1 to 130-N of non-volatile memory cells in respective read/write pipelines 110-1 to 110-N. Read/write pipelines 110-1 to 110-N and arrays 130-1 to 130-N are sometimes referred to herein as pipelines 110 and arrays 130. Although FIG. 1 shows three such pipelines 110, memory 100 can include any number N of pipelines. The number of pipelines provided determines the number of simultaneous read or write operations memory 100 can conduct and accordingly controls the maximum read and write frequency or data transfer rate of memory 100. As described more fully below, a timing circuit 140 sequentially starts pipelines 110 on sequential write operations and output operations, and pipelines 110 operate simultaneously to complete the operations.

Each non-volatile memory array 130 can be conventional non-volatile memory array. Such memory arrays are well known for storing a binary, analog, or multi-bit digital value in each memory cell. Arrays 130 include rows and columns of memory cells, where each memory cell is, for example, a single floating gate transistor, a split gate transistor, or a multiple-transistor memory cell. In an exemplary embodiment of the invention, which is described in the following, memory 100 is a flash EEPROM, and each memory cell consists of a single N-channel floating gate transistor. Control gates of the memory cells in a row of an array 130 are coupled to a row line associated with the row. Drains of the memory cells in a column of an array 130 are coupled to a column line associated with the column, and sources of the memory cells in a sector of an array 130 are coupled to a source line associated with the sector. In the exemplary embodiment, each sector contains multiple columns of memory cells but alternative memory architectures use different kinds of sectors, for example, sectors containing one or multiple rows of memory cells.

Memory arrays 130 are separate in that erase, write, and read operations in one array 130 do not affect erase, write, and read operations in other arrays 130. Each memory array 130 has a row decoder 132, a column decoder 134, and a sense amplifier circuit 136. (Sense amplifier circuit 136 may contain multiple sense amplifiers.) Each row decoder 132 selects a row line in the associated array 130 and during erase, write, and read operations, conveys biasing voltages to the selected row line and unselected row lines in the array 130. Each column decoder 134 selects a column line in the associated array 130 and conveys biasing voltages to the selected column line and unselected column lines in the associated array 130 during erase, write, and read operations. Column decoders 134 also connect associated sense amplifier circuits 136 to the associated memory arrays 130 for read operations. A global sector erase decoder 172 conveys the appropriate bias voltages to source lines for all sectors in arrays 130. Sense amplifier circuits and row, column, and erase decoders are well known. However, as described more fully below, output signals from sense amplifier circuits 136 clock or trigger sample-and-hold circuits or other temporary storage circuits and may include circuitry such as a one-shot circuit in addition to conventional sense amplifier circuitry. U.S. Pat. No. 5,687,115, which is hereby incorporated by reference in its entirety, illustrates examples of such circuits.

For an erase operation, an erase control circuit 170 generates an erase signal Verase (typically about 12 V during an erase) and causes decoder 172 to select one or more sectors in arrays 130. In particular, decoder 172 receives erase signal Verase and one or more address signals identifying one or more sectors selected for erasure. Decoder 172 then applies erase signal Verase to the source lines of the selected sectors and grounds the source lines associated with the unselected sectors. Row decoders 132 grounds all of the row lines in the arrays containing one or more of the selected sectors, and column decoders 134 allow all column lines associated with the sectors being erased to float. Erase control circuit 170 contains a voltage generator, typically a charge pump, for generating a high voltage for erase signal Verase and control circuitry for selecting which sectors to erase.

A sequence of write operations, sometimes referred to herein as a recording operation, sequentially writes a series of values in a number of memory cells. In memory 100 the values written are samples of an analog input signal Ain representing either an analog data value or a multi-bit digital data value. Alternatively, the input signal can be a digital signal. A playback operation reads and sequentially outputs the series of values (or samples from memory 100) to reproduce the recorded sequence (or signal). In one embodiment of the invention, memory 100 uses pipelines 110-1 to 110-N in a staggered parallel fashion during recording or playback to provide a high write or read data transfer rate. An alternative playback operation performs parallel read operations in pipelines 110 but serially shifts out the values read from the memory cells.

A timing circuit 140 starts operations in pipelines 110. In the exemplary embodiment of the invention, timing circuit 140 includes an OR gate 142 and N flip-flops 144-1 to 144-N connected in a ring so that timing circuit 140 operates as a shift register. Flip-flops 144-1 to 144-N respectively correspond to read/write pipeline 110-1 to 110-N and start the corresponding pipelines 110 on write operation at rising edges of output signal SR1 to SRN. The write circuitry in memory 100 includes circuitry in each pipeline 110 and a write voltage generator 150 which pipelines 110-1 to 110-N share. In memory 100, write voltage generator 150 generates two write signals Vpp and Vvfy from input signal Ain. Write signal Vpp provides a programming voltage that write circuitry applies to the control gate of a memory cell during programming to change the threshold voltage of the memory cell. The voltage of write signal Vpp has a one-to-one correspondence with the present level of input signal Ain. Typically, write voltage generator 150 selects a higher voltage level for Vpp when a higher threshold voltages is being written. Appropriate selection of voltage Vpp makes programming time for writing a precise analog value nearly independent of the target threshold voltage. Thus, the write resolution is uniform across the range of threshold voltages. Write signal Vvfy, which has a voltage corresponding to the target threshold voltage to be written to the memory cell, is used to accurately determine when the target threshold voltage is reached whereupon the write operation stops. In particular, an interative program-and-verify write process such as described below minimizes effects of memory cell variation. Alternatively, a timed write process stops the write process after a specific time and does not require write signal Vvfy or the circuitry associated with generating or holding signal Vvfy. In this case, one sample-and-hold circuit per pipeline is sufficient.

In the exemplary embodiment of the invention, generator 150 includes a voltage shifter that linearly maps input signal Ain, which is, for example, in a range from 3 to 6 volts, to signal Vpp in a range from 9 to 12 volts and to signal Vvfy in a range from 3 to 6 volts. Voltage generators for write circuits in analog or multiple-bits-per-cell memories are further described in U.S. Pat. No. 5,687,115.

The write circuitry in each pipeline 110 includes row decoder 132, column decoder 134, sense amplifier circuit 136, a row line voltage selection circuit 138, and sample-and-hold circuits 121 and 122. Multiplexers 123 and 124 are coupled to sample-and-hold circuits 121 and 122 and respectively select trigger signals and input signals for sample-and-hold circuits 121 and 122. For a write operation, multiplexer 123 selects the output of the associated flip-flop 144 to trigger both sample-and-hold circuits 121 and 122, and input selection circuit 124 selects and applies signals Vpp and Vvfy to respective input terminals of sample-and-hold circuits 121 and 122. When the output signal from the associate flip-flop 144 transitions, sample-and-hold circuits 121 and 122 sample and store the current voltages of respective write signals Vpp and Vvfy. Voltage selection circuit 138, which selects the appropriate bias voltage that row decoder 132 applies to the selected row line, during a write selects the voltage from a selection circuit 126. Selection circuit 126 alternates between selecting saved signals Vpp and Vvfy from sample-and-hold circuits 121 and 122 respectively during a write operation as described further below.

Figure 2:
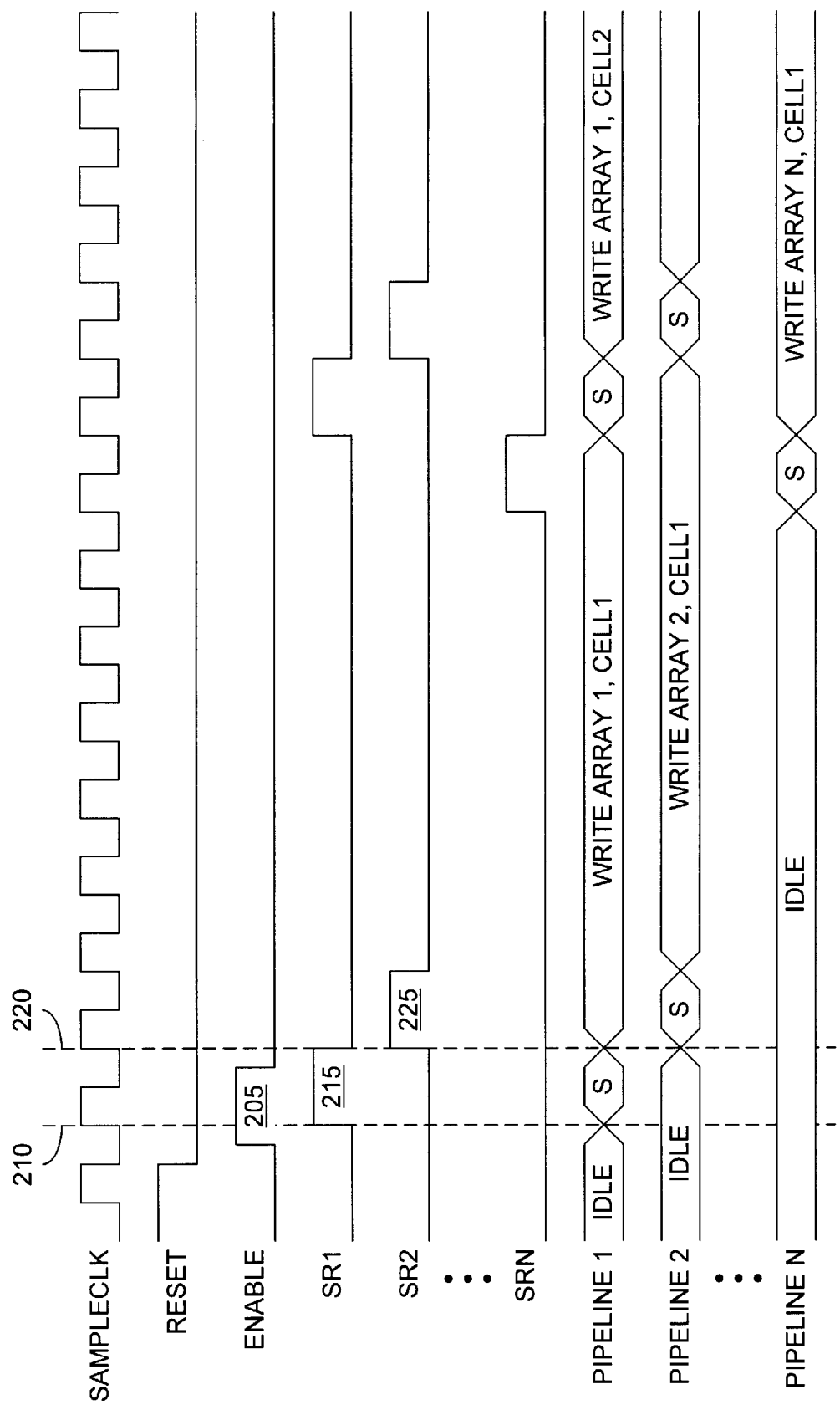
FIG. 2 shows timing diagrams for a recording process in accordance with an embodiment of the invention.

FIG. 2 shows timing diagrams for a recording process in memory 100. Initially, a signal RESET resets flip-flops 144, and memory arrays 130 are prepared for write operations. For most non-volatile memories such as EEPROM, EPROM, or Flash memory preparation for a write operation includes erasing storage locations to which information will be written. To start recording, signal RESET is deasserted, and a pulse 205 in an input signal ENABLE to OR gate 142 is asserted high for about one clock cycle of a clock signal SAMPLECLK. OR gate 142 provides enable pulse 205 as the input signal to flip-flop 144-1, and an output signal SR1 from flip-flop 144-1 goes high at a rising edge 210 of signal SAMPLECLK, which occurs during pulse 205 in signal ENABLE. In response to the next rising edge 220 of sampling clock SAMPLECLK, flip-flop 144-1 deasserts signal SR1, and flip-flop 144-2 asserts signal SR2. A pulse thus propagates through flip-flops 144-1 to 144-N, and signals SR1 to SRN sequentially trigger sample-and-hold circuits 121 and 122 in pipelines 110-1 to 110-N. Each pipeline 110 thus begins sampling write signals Vpp and Vvfy at different times. The last flip-flop 144-N is coupled to an input terminal of OR gate 142 so that signal SR1 is asserted again after signal SRN. The recording process continues starting write operations by cyclically triggering sample-and-hold circuits 121 and 122 in a pipelined manner until signal RESET stops the pulse from propagating around the ring of flip-flops 144.

During a write, sample-and-hold circuits 121 and 122 in pipelines 110-1 to 110-N sample write signals Vpp and Vvfy in response to the corresponding signals SR1 to SRN. When signal SR1 is asserted at time 210, sample-and-hold circuits 121 and 122 in pipeline 110-1 sample write signals Vpp and Vvfy, and pipeline 110-1 begins writing in a memory cell of array 130-1 a value of signal Ain represented during interval 215. When signal SR2 is asserted at time 220, sample-and-hold circuits 121 and 122 in pipeline 110-2 sample write signals Vpp and Vvfy, and pipeline 110-2 begins writing in a memory cell of array 130-2 a value signal Ain represented during interval 225. Each row voltage select circuits 138 uses the sampled values of the write signals Vpp and Vvfy from multiplexer 126 for a write process that sets the threshold voltage of a selected memory cell to a target threshold voltage. The target threshold voltage is the level that represents the voltage of input signal Ain when write signals Vpp and Vvfy were sampled.

An exemplary write process includes generating a series of programming pulses that are interleaved with verify cycles. During each programming pulse, multiplexer 126 selects the Vpp sample from sample-and-hold circuit 121, and row decoder 132 applies the sampled voltage to a row line selected according to an input address signal identifying a selected memory cell in array 130. Voltage Vpp is typically in the range from 9 to 12 volts. Row decoder 132 grounds unselected row lines. Column decoder 134 applies a programming voltage Vpc (typically between 5 and 6 volts) to the column line connected to the selected memory cell and grounds unselected column lines. Decoder 172 grounds the source line of the sector containing the selected memory cell. The combination of voltages applied to the control gate, source, and drain of the selected memory cell during a programming pulse causes channel hot electron injection into the floating gate of the selected memory cell and increases the threshold voltage of the selected memory cell.

During a verify cycle, multiplexer 126 selects the Vvfy sample from sample-and-hold circuit 122. Row decoder 132 applies the sampled level of signal Vvfy to the selected row line and grounds the unselected row lines. Column decoder 134 applies a read voltage Vrc (typically about 1 to 2 volts) and connects sense amplifier 136 to the selected column line.

Column decoder 134 grounds the unselected column lines. Decoder 172 continues to ground the source line coupled to the selected memory cell. When the programming pulses raise the threshold voltage of the selected memory cell to the sampled level of signal Vvfy, sense amplifier 136 senses during a verify cycle that the memory cell does not conduct and sends a signal to stop further programming pulses. Programming pulse can be stopped for example, by stopping further applications of sampled voltage Vpp to the selected row line, stopping application of voltage Vpc to the selected column line, or both. Thus, the programming pulses raise the threshold voltage to the level of sampled voltage Vvfy and then are stopped. The available write time for a pipeline 110 is N times the period of clock signal SAMPLECLK where N is the number of pipelines 110. Accordingly, the number of pipelines can be selected according to the required write time per pipeline 110 and the desired write frequency. For example, with a write time Tw of 10 µs, 64 pipelines are required to achieve a sampling rate of 6.4 MHz.

Pipelines 110-1 to 110-N begin write operations at different times and overlap write operations at different stages of completion. To permit this, memory arrays 130-1 to 130-N are separated so that source, drain, and control gate voltages generated in one pipeline 110 do not interfere with voltages in other pipelines 110. In accordance with an aspect of the invention, memory 100 is still fabricated as a single integrated circuit. Alternatively, memory 100 can be fabricated as two or more integrated circuits each containing one or more recording pipeline. For example, N separate integrated circuits can be connected together using discrete shift registers and logic.

An advantage of pipelined write operations is the reduction in the total peak programming current that an internal charge pump circuit must supply to column decoders 134. Specifically, a memory cell consumes more programming current from a column decoder 134 (i.e., the programming voltage Vpc) during the initial programming pulses when the threshold voltage of the memory cell differs most from its target threshold voltage. As the threshold voltage of a cell nears the target threshold voltage, programming current drops significantly. Accordingly, when write operations are started in N pipelines simultaneously, the pipelines consume a peak current that is N times the maximum current Imax drawn in a single pipeline. Starting the write operations at different times and overlapping the write operations at different stages of completion reduces the peak current and its associated noise spike in the power supply because most of the pipelines draw much less than the maximum current Imax and the initial high programming currents of the memory cells being programmed are distributed and averaged over time.

Typically, reading of non-volatile analog memory is faster than writing, and sequential reading of memory cells with no overlap of the read operations may be sufficient to read an analog value from a memory cell or playback an analog signal from a series of memory cells. Accordingly, pipelines 110 can be used sequentially for non-overlapping reads from memory arrays 130-1 to 130-N. However, a playback system with pipelined or parallel reads can provide for higher sampling frequencies or to accommodate slower (and usually more accurate) read processes. In accordance with an aspect of the invention, parallel or pipelined read operations can use a shared read circuit which decreases the circuit area required for each pipeline and an integrated circuit memory as a whole.

An exemplary read process in a pipeline 110 slowly changes the control gate voltage of a selected memory cell until the conductivity of the selected memory cell changes. When the conductivity changes, the control gate voltage is approximately equal to the threshold voltage of the selected memory cell and can be converted into an output voltage representing the value read. In memory 100, read circuitry includes a voltage ramp circuit 160 which ramps the control gate voltages for pipelines 110. In a first exemplary playback operation illustrated in FIG. 3, a bank (one half or some other fraction) of the pipelines performs parallel read operations and stores read values read in sample-and-hold circuits 121. For example, in one embodiment of the invention memory 100 includes eight pipelines 110 which are divided into two banks of four. While one bank of the pipelines 110 performing reads (e.g., pipelines 110-5 to 110-8), timing circuit 140 controls sequential output of previously read values from sample-and-hold circuits 121 in another bank of pipelines (e.g., pipelines 110-1 to 110-4). This approach removes the read access time as the limiting factor on read output rate by making the read output rate the same as the frequency of the sample clock SAMPLECLK. The required read time, including the row line RC delay and the sense amplifier delay, only affects latency of the read operation. This allows the data to be read out at a high clock rate.

The exemplary playback process starts at time 300 when a signal READ is asserted and, voltage ramp circuit 160 begins increasing read signal Vsr from just below a minimum threshold voltage VTmin representing information stored in a memory cell toward a maximum threshold voltage VTmax representing information stored in a memory cell. Linearly increasing signal Vsr is just one example of a method in which ramp circuit 160 can vary signal Vsr. Alternatively, ramp circuit 160 can monotonically increase or decrease signal Vsr across a range including voltages VTmax and VTmin. Preferably, signal Vsr has a range of voltages that starts below voltage VTmin and extends beyond voltage VTmax. Once signal Vsr reaches the maximum of its range, ramp circuit 160 quickly resets signal Vsr back to its minimum voltage. At time 310, signal Vsr then begins slowly increasing again. Between times 300 and 310, each of pipelines 110-1 to 110-4 performs a read operation, and pipelines 110-5 to 110-8 are idle. In the bank performing a read, voltage selection circuits 138 and the associated row decoders 132 select and apply signal Vsr to the row lines connected to the selected memory ells in the associated arrays 130. For the read process, the same address signal can be simultaneously applied to each array 130 (i.e., row and column decoders 132 and 134), and address signals to each array 130 are incremented after every other ramp of signal Vsr. Unselected row lines are grounded. Simultaneously, column decoders 134 apply read voltage Vrc and connect sense amplifiers 136 to the column lines coupled to the selected memory cells. For the read, multiplexer 123 connects a trigger signal from sense amplifier 136 to the clock terminal of sample-and-hold circuit 121, and multiplexer 124 connects read signal Vsr to the input of sample-and-hold circuit 121. When the selected memory cell in an array 130 changes conductivity, the associated sense amplifier 136 activates the associated sample-and-hold circuit 121 which then stores the voltage of signal Vsr. Sampling of signal Vsr can occur at any time during the interval 300 to 310. When sampling occurs in a particular pipeline 110 depends on the value being read from that pipeline.

By time 310, signal Vsr has run across the range including VTmin and VTmax, and each pipeline 110-1 to 110-4 in the first bank has stored a read value in sample-and-hold circuit 121. Ramp circuit 160 again begins to increase the voltage of signal Vsr so that between time 310 and time 320 pipelines 110-5 to 110-8 can perform read operations. Between times 310 and 320, pipelines 110-1 to 110-4 do not perform read operations, but timing circuit 140 controls output of the previously read values from pipelines 110-1 to 110-4. In particular, a pulse 305 in signal ENABLE is asserted so that flip-flop 144-1 asserts output signal SR1 at time 310. When signals READ and SR1 are asserted, sample-and-hold circuit 121 in pipeline 110-1 provides an output signal Aout via multiplexer 126 and AND gate 128. In the next period of signal SAMPLECLK, signal SR1 is deasserted, and signal SR2 is asserted. When signals READ and SR2 are asserted, sample-and-hold circuit 121 in pipeline 110-2 provides output signal Aout. In four periods of signal SAMPLECLK, all data is output from pipelines 110-1 to 110-4, and pipelines 110-5 to 110-8 complete four read operations. Between times 320 and 330, pipelines 110-1 to 110-4 read the next set of values from arrays 130-1 to 130-4, and sample-and-hold circuit 121 in pipelines 110-5 to 110-8 provides signal Aout.

In accordance with another aspect of the invention, sample-and-hold circuits 122 can sample values read from reference memory cells while sample-and-hold circuits 121 sample the threshold voltages of the memory cells being read. A difference amplifier (not shown) coupled to the output terminals of sample-and-circuits 121 and 122 in a pipeline 110 can then generate output voltage Aout according to the difference in a value read from a memory cell and a reference value read from a reference cell. Using the difference to generate the output signal Aout cancels may of the systematic variation in the performance of memory arrays 130.

Figure 4:
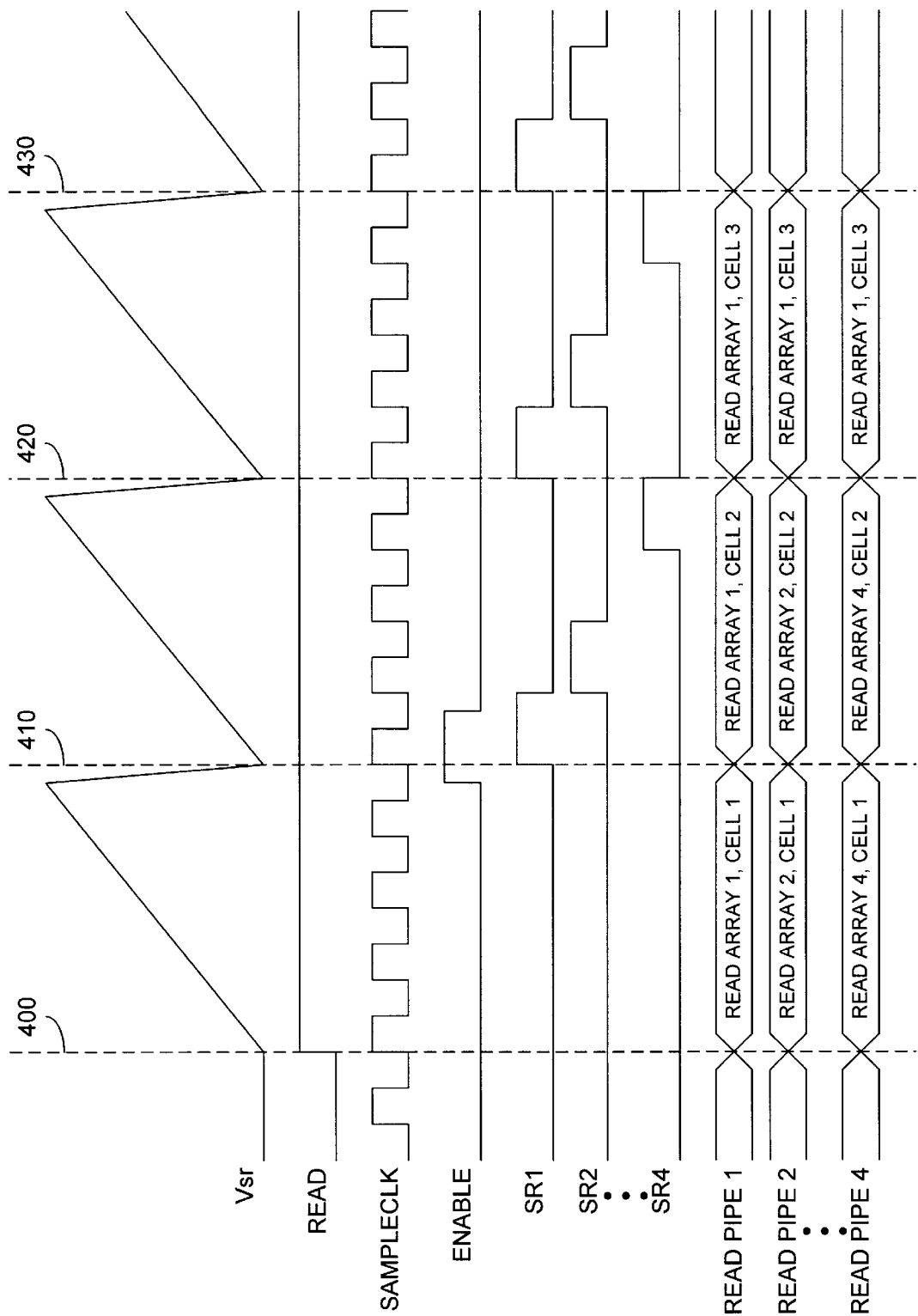

FIG. 4 illustrates a second exemplary read process. The second read process uses both sample-and-hold circuits 121 and 122. The read process of FIG. 4 begins at time 400 when signal READ is asserted and ramp circuit 160 begins increasing the voltage of signal Vsr. During an interval between times 400 and 410, signal Vsr runs from voltage VTmin to VTmax and all of the pipelines 110 perform read operations. The address signals applied to each array can all be the same so that each pipeline 110 reads memory cells having the same relative position in array 130. Multiplexers 123 select sense amplifier 136 to trigger sampling by sample-and-hold circuits 121 and disable triggering of sample-and-hold circuits 122. Multiplexer 124 applies read signal Vsr to the input terminals of sample-and-hold circuits 121. Thus, the results of the read operations are stored in sample-and-hold circuits 121. At time 410, the first set of read operations is complete, the address signal applied to arrays 130 is incremented, and a second set of read operations begin. Multiplexers 123 then disable triggering of sample-and-hold circuits 121 and select sense amplifier 136 to trigger sample-and-hold circuits 122. Multiplexer 124 applies read signal Vsr to the input terminals of sample-and-hold circuits 122. The second set of read operations thus save values read in sample-and-hold circuits 122 and preserves the value already in sample-and-hold circuit 121.

Simultaneous with the second set of read operations, the values read during the first set of read operations are output from sample-and-hold circuits 121. In particular, at or before time 410, a pulse in signal ENABLE is asserted to begin the output operations. Between times 400 and 410, multiplexers 126 selects the value from sample-and-hold circuits 121. Each AND 128 gate enables output of the selected value from the associated sample-and-hold circuit 121 when the associated flip-flop 144 asserts the associated one of signals SR1 to SRN. Initially, flip-flop 144-1 asserts signal SR1 at a rising edge of sample clock signal SAMPLECLK, and pipeline 110-1 provides output signal Aout. Each cycle of signal SAMPLECLK thereafter causes the next flip-flop 144 to enable output from the next pipeline 110.

Figure 3:
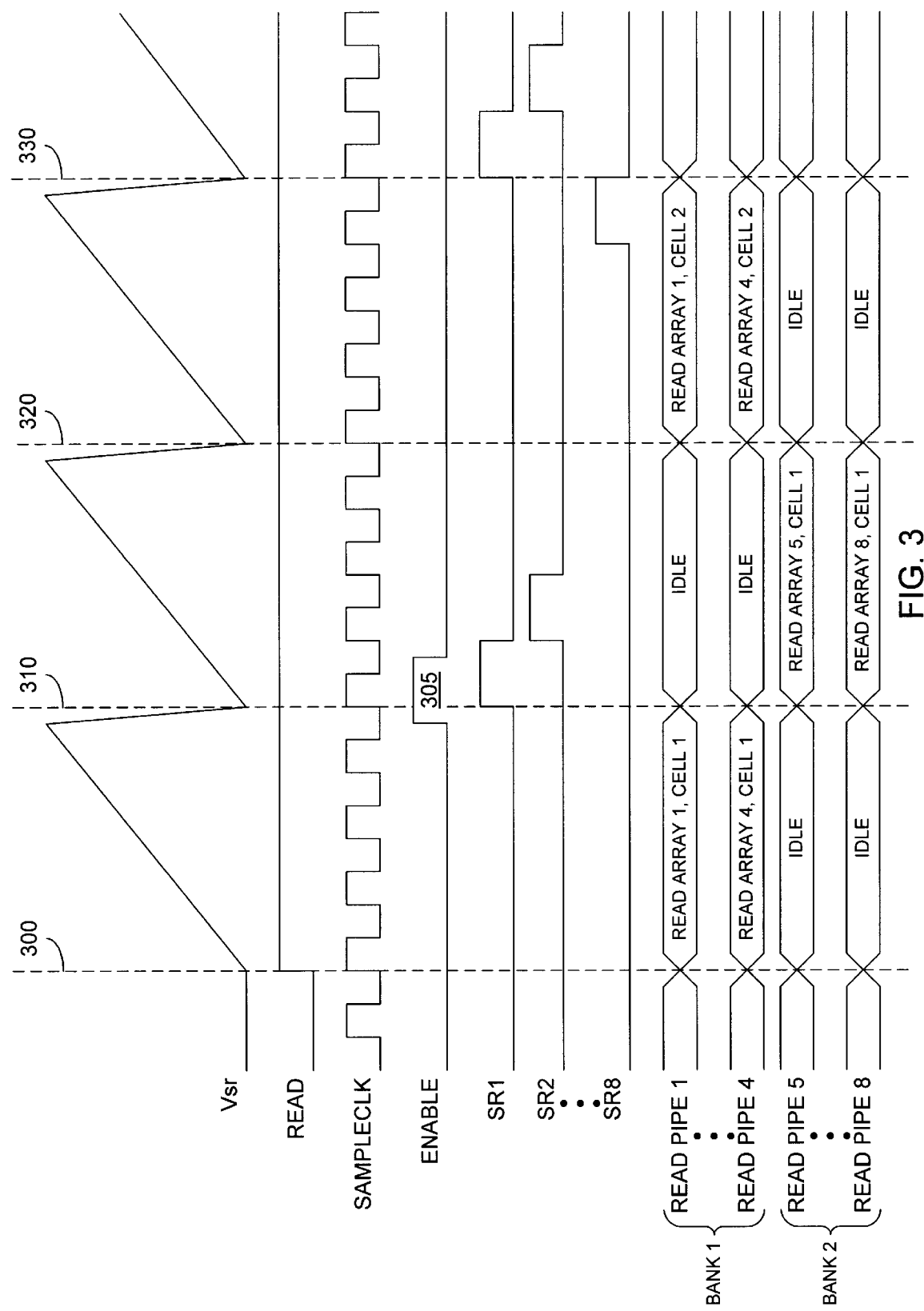
FIGS. 3 and 4 show timing diagrams for playback process in accordance with alternative embodiments of the invention.

By time 420, the second set of read operations is complete, and all of values read in the first set of read operations have been output. The roles of sample-and-hold circuits 121 and 122 are reversed in each pipeline 110. Accordingly, between times 420 and 430, sample-and-hold circuits 121 receives values read from arrays 130, and sample-and-hold circuits 122 provide output signal Aout. A constant data flow can be maintained by repeatedly interchanging the roles of sample-and-hold circuits 121 and 122 for each set of parallel read operations. Alternatively, at time 410, all of the sampled values from sample-and-hold circuits 121 can be transferred to associated sample-and-hold circuits 122 to be output sequentially between times 410 and 420. Transferring the sampled values to sample-and-hold circuits 122 frees sample-and-hold circuits 121 for a set of read operations performed between times 410 and 420. An advantage of the playback process of FIG. 4 has over the playback process of FIG. 3 is that the process of FIG. 4 requires half as many pipelines 110 to maintain the same constant information output rate. However, since write processes tend to be slower that read process, the write speed is typically the controlling factor when determining the number of pipelines required to maintain a specific information flow rate, and the first process may permit simpler control circuitry for read processes.

FIGS. 5A and 5B show alternative waveforms for signal Vsr, that are suitable for the read processes of FIGS. 3 and 4. In FIGS. 3 and 4, signal Vsr has a slow low-to-high ramp. The waveform of FIG. 5A includes a slow high-to-low ramp (i.e., decline) in voltage. Using signal Vsr of FIG. 5A, sense amplifier 136 senses the target memory cell transition from conducting to non-conducting during the decline of read signal Vsr, and in response to the transition, sense amplifier 136 triggers sample-and-hold circuit 121 or 122. For the waveform shown in FIGS. 3 and 4, sense amplifier 136 senses the target memory cell transition from the non-conducting to the conducting.

The waveform for signal Vsr in FIG. 5B includes slowly rising (low-to-high) ramp and slowly falling (high-to-low) ramp. Accordingly, sense amplifier 136 can sense a selected memory cell change from non-conducting to conducting and from conducting to non-conducting. Sense amplifier 136 can trigger sample-and-hold 121 to sample signal Vsr for the non-conducting to conducting transition and trigger sample-and-hold 122 to sample signal Vsr for the conducting to non-conducting transition. Additional circuitry (not shown) can be added to average the two sampled voltages and generate output signal Aout. Such averaging can eliminate or minimize any offset and hysteresis between the two transitions.

FIG. 5B also illustrates an alternative playback process that staggers the starting of read operations in pipelines 110. For example, the playback process starts a read operation in pipeline 110-1 at time 511 at the start of a rising ramp 510 in signal Vsr. The read operation for pipeline 110-1 continues through rising and falling ramps 510 and 520 of signal Vsr and ends at time 521. At time 521, pipeline 110-1 outputs an average of a voltage that sample-and-hold circuit 121 sampled when the selected memory cell transitioned from non-conducting to conducting and a voltage that sample-and-hold circuit 122 sampled when the selected memory cell transitioned from conducting to non-conducting. Pipeline 110-2 starts a read operation at time 512 after the start of rising ramp 510 and continues the read operation through falling ramp 520 and part of a rising ramp 530 before ending at time 522. Since the-read operation of pipeline 110-2 begins after signal Vsr may have risen above VTmin, the selected memory cell in pipeline 110-2 may be conducting or non-conducting at time 512, depending on the threshold voltage of the selected memory cell. Accordingly, sense amplifier 136 observes the transition between the non-conducting to conducting states of the selected memory cell on rising ramp 510 or rising ramp 530. If a transition is observed on slope 530, any value that sample-and-hold circuit 121 sampled for a previous (possibly spurious) non-conducting to conducting transition is overwritten. At time 522, pipeline 110-2 outputs an average of the voltages sampled at two transitions.

Each read operation for a pipeline 110 is offset by a time DT from the start of a previous read operation in another pipeline 110. For an extended or continuous playback operation, the interval DT is about equal to the time RT required for a read operation divided by the number N of pipelines 110. Accordingly, N pipelines can cyclically perform read operations without idle time. An advantage of the pipelined read process is that time between sampling signal Vsr and output as signal Aout is more uniform across pipelines 110. When pipelines 110 perform read operations in parallel, the last pipeline 110 to provide an output value often must hold a sample longest, and that sample may degrade more than samples output from other pipelines 110. The offset or staggerred starting of read operations is not limitted to signal Vsr having the waveform of FIG. 5B but can also be use when signal Vsr has other waveforms such as the waveforms shown in FIGS. 4 and 5A.

For the read operations described above, the output signal Aout is the threshold voltage read from selected memory cells. If the threshold voltage is the desired output, signal Aout can be used as output without further conversion. Alternatively, there is a mapping between the threshold voltages of memory cells and the voltage range of the desired output analog signal, and a converter such as a voltage shifter or and amplifier can convert signal Aout as desired. This conversion is typically the inverse of the voltage conversion that write voltage generator 150 performs when generating write signal Vvfy from input signal Ain. In an alternative memory embodiment, voltage ramp circuit 160 generates signal Vsr and a second read signal which is the result of applying the desired conversion to signal Vsr. This second read signal can be coupled to the input terminals of the sample-and-hold circuits 121 and 122 for sampling when the conductivity of the selected memory transitions. Accordingly, the sampled values of the second read signal can be output from sample-and-hold circuits 121 and 122 as signal Aout, and signal Aout will not require conversion.

Although memory 100 was described in the context of storing analog values in memory cells, with minor alteration, memory 100 could store multiple bits of information per memory cell. In particular, voltage generator 150 can be adapted by including a digital-to-analog converter (DAC) to receive a multi-bit digital signal and convert the multi-bit digital signal to the analog signal Ain. Generator 150 can then generate write signals Vpp and Vvfy at the appropriate programming and verify voltages for writing the multi-bit digital signal to a memory cell. An analog-to-digital converter (not shown) can convert output analog signal Aout to a multi-bit digital signal.

Figure 6:
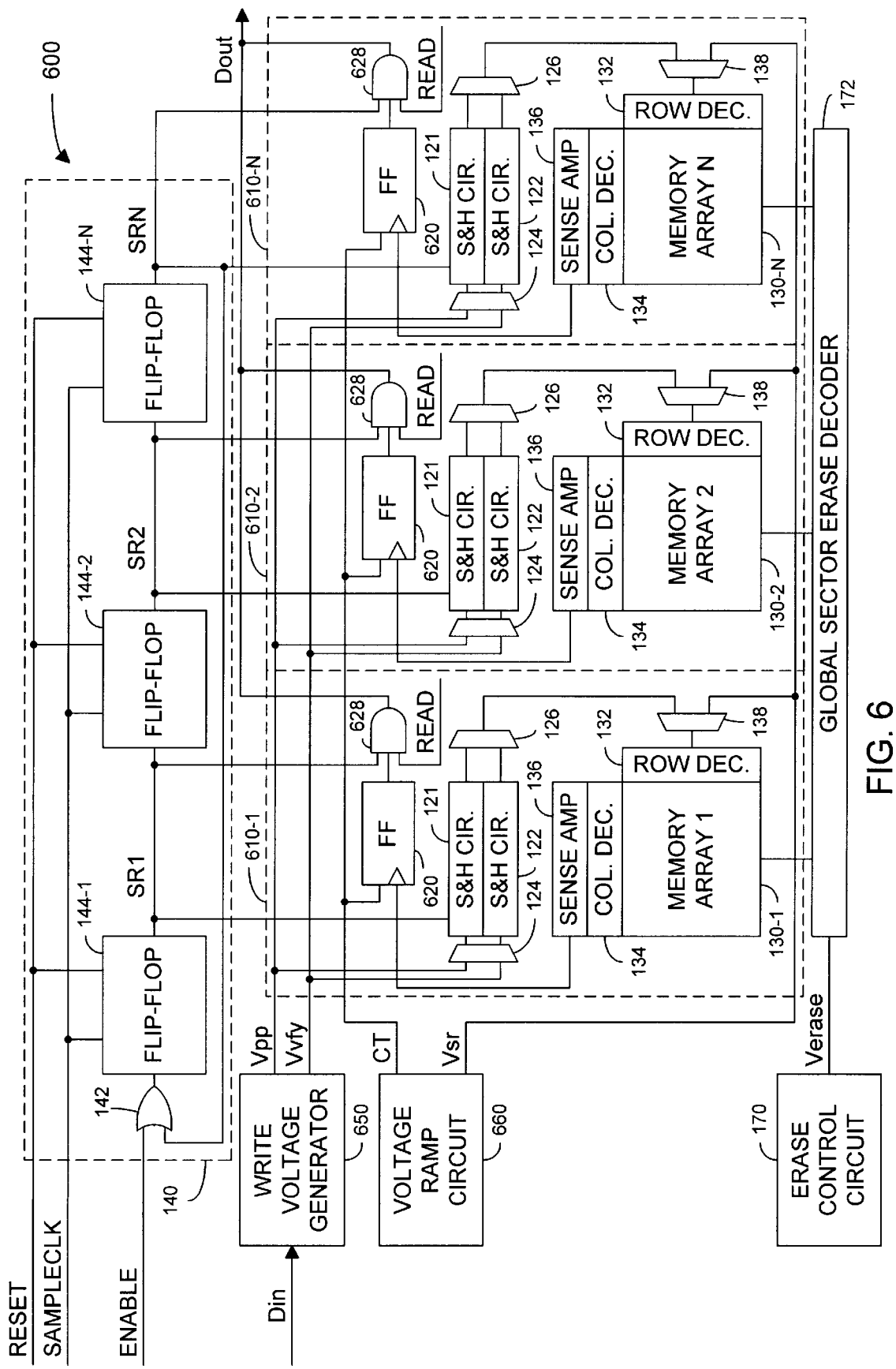
FIG. 6 is a block diagram of a multiple-bits-per-cell memory in accordance with an embodiment of the invention.

FIG. 6 shows a multiple-bits-per cell memory 600 in accordance with another embodiment of the invention. Memory 600 is similar to memory 100 and includes N write/read pipelines 610 each of which includes a memory array 130 with associated row decoder 132, column decoder 134, and sense amplifier 136. Arrays 130 are arrays of non-volatile memory cells as described above in regard to memory 100 of FIG. 1. However, memory 600 uses arrays 130 to store multiple bits of digital information in each memory cell. To accommodate multiple bits per memory cell, memory 600 includes a write voltage generator 650 that receives a multi-bit digital signal Din representing a value to be written to a single memory cell. From signal Din, generator 600 generates write signals Vpp and Vvfy at the appropriate levels for writing of the value of signal Din to a memory cell. Each pipeline 610-1 to 610-N includes sample-and-hold circuits 121 and 122, which respectively sample and hold values of signals Vpp and Vvfy for write or record operations as described above in regard to memory 100.

Recording operations in multiple-bits-per-cell memory 600 can store large digital values as a series of smaller digital values. For example, if each memory cell in arrays 130 can store four bits of information, a 32-bit data value requires eight memory cells for storage. A recording operation can sequentially start eight 4-bit write operations in eight pipelines 110. Unlike the analog case where long series of samples are written, digital write operations are usually of a fixed size according to a data port of the memory. Accordingly, the period of clock signal SAMPLECLK can be shorter than the required write time divided by the number N of pipeline 110, provided that recording operations do not need to reuse any of the pipelines.

For read operations, voltage ramp circuit 660 generates read signal Vsr having a waveform such as described above and a digital signal CT which corresponds to voltage of signal Vsr. In an exemplary embodiment, voltage ramp circuit 660 includes a digital-to-analog converter (DAC) having an input port coupled to a counter. Signal CT is the output signal from the counter, and signal Vsr is the output signal from the DAC. U.S. patent application Ser. No. 09/053,716, filed Apr. 1, 1998 further describes read circuits that include counters for reading multiple-bits-per-cell memories and is hereby incorporated by reference in its entirety. The counter counts up or down to increase or decrease the voltage of signal Vsr. Voltage ramp circuit 660 applies read signal Vsr to multiplexers 138 which select signal Vsr as the row line voltage for the selected memory cells. Voltage ramp circuit 660 applies count signal CT to flip-flops 620 in pipelines 610. In alternative embodiment, flip-flops 620 can be replaced by latches or some other digital storage. The flip-flops 620 in each pipeline 610 have input data terminals that receives digital count signal CT, a clock terminal coupled to sense amplifier 136, and an output data port coupled to a set of AND gates 628. For the read operation, row decoder applies signal Vsr to the selected row line, decoder 172 grounds the source lines, and column decoder applies read Vrc to the selected column line. Sense amplifier 136 senses when signal Vsr is the level of a transition in the conductivity of the selected cell. When the selected cell transitions, sense amplifier 136 clocks the associated flip-flops 620, and flip-flops 620 register a digital value of signal CT that corresponds to the threshold voltage of the selected memory cell. To output the digital value from a set of flip-flop 620 while signal READ is asserted, the associated flip-flop 144 in timing circuit 140 asserts a signal causing AND gates 628 to pass the multi-bit digital value from flip-flop 620 as output signal Dout. Alternatively, all or several pipelines 610 can simultaneously output bits that constitute output signal Dout. For example, eight pipelines 610 that store four bits per memory cell can provide a 32-bit output signal Dout.

Figure 7:
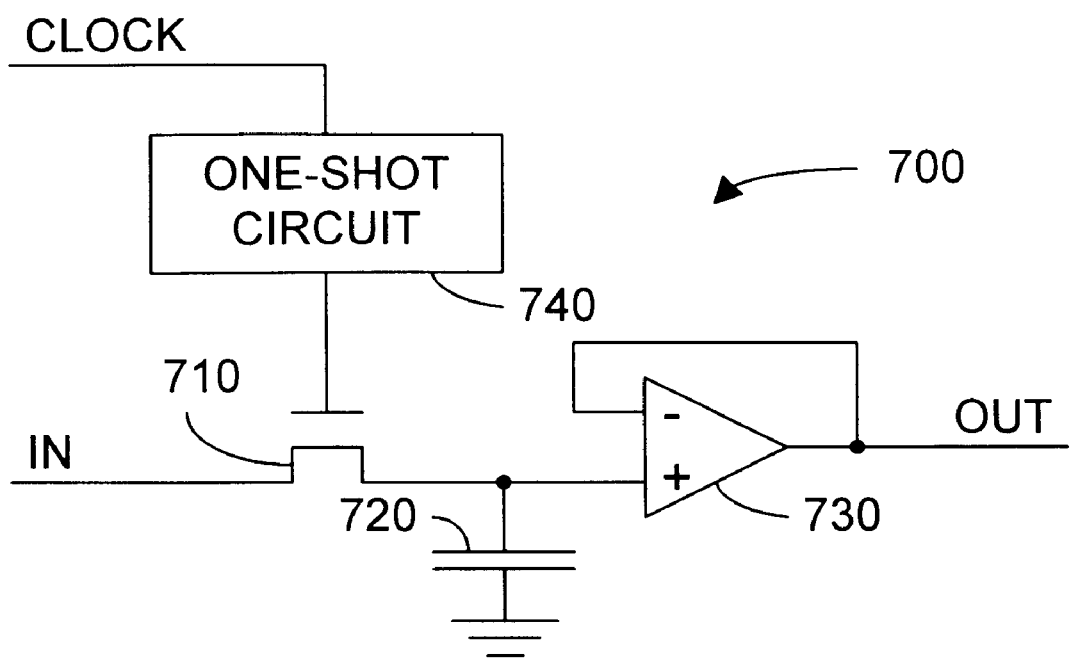
FIG. 7 shows a sample-and-hold circuit suitable for the memories of FIGS. 1 and 6.

FIG. 7 shows a block diagram of a sample-and-hold circuit 700 suitable for memories in accordance with the above described embodiments of the invention. Sample-and-hold circuit 700 includes an input transistor 710, a capacitor 720, an operational amplifier 730, and a one-shot circuit 740. In operation, an input signal to be sampled is applied to an input terminal IN. When transistor 710 is on, transistor 710 allows the input signal to charge or discharge capacitor 720. Operational amplifier 730 provides on an output terminal OUT an output signal having the same voltage as on capacitor 720. Amplifier 730 also prevents leakage to or from capacitor 720 via terminal OUT. One shot-circuit 740 receives a clock or trigger signal on clock terminal CLOCK and at a specific edge in the clock signal, e.g., a rising edge, generates a pulse which turns off transistor 710 to hold the sampled value in capacitor 720. Accordingly, sample-and-hold circuit 700 operates as an edge triggered device which sense amplifier 136 or an associated flip-flop 144 can trigger to cause sampling of the input signal.

Although the invention has been described with reference to particular embodiments, the description is only an example of the invention's application and should not be taken as a limitation. In particular, even though much of preceding discussion was aimed at memory cells containing N-channel floating gate transistors that are programmed from an erased state by increasing the threshold voltages of the floating gate transistors, alternative embodiments of this invention may include other types of devices such as P-channel device and may include memories where programming of a memory cell decreases the threshold voltage of the cell from an erased state having a high threshold voltage. Further, although described embodiments of the invention include write and read circuitry which multiple write/read pipelines share, alternative embodiments of the invention may only share read circuitry or write circuitry so that each pipeline includes a complete write circuit or a complete read circuit. Various other adaptations and combinations of features of the embodiments disclosed are within the scope of the invention as defined by the following claims.

We claim:

1. A memory comprising:
    a plurality of pipelines, wherein each pipeline comprises:
        an array of non-volatile memory cells;
        a first sample-and-hold circuit;
        a selection circuit that during a write operation selects as a row line voltage, from a set of voltages including a first voltage from the first sample-and-hold circuit;
        a row decoder coupled to the array and the selection circuit, wherein the row decoder selects a row line and applies the row line voltage from the selection circuit to the selected row line; and
    a voltage generator that generates a first write signal having a voltage that depends on a data signal input to the voltage generator, wherein each first sample-and-hold circuit in the pipelines is coupled to sample the first write signal.

2. The memory of claim 1, further comprising a timing circuit coupled to the first sample-and-hold circuits in the pipelines, wherein the timing circuit controls when each first sample-and-hold circuit samples the first write signal.

3. The memory of claim 2, wherein the pipelines have a sequential order, and the timing circuit sequential causes first sample-and-hold circuits to sample the first write signal in a sequential order according to the pipeline containing the sample-and-hold circuits.

4. The memory of claim 1, wherein:
    the voltage generator generates a second write signal;
    each pipeline further comprises a second sample-and-hold circuit coupled to sample the second write signal; and
    during the write operation, the set of voltage from which the selection circuit selects the row line voltage includes a second voltage from the second sample-and-hold circuit.

5. The memory of claim 4, further comprising a timing circuit coupled to the first and second sample-and-hold circuits in the pipeline, wherein the timing circuit controls when each first sample-and-hold circuit samples the first write signal and when each second sample-and-hold circuit samples the second write signal.

6. The memory of claim 5, wherein the pipelines have a sequential order, and the timing circuit sequential causes first and second sample-and-hold circuits to sample the first and second write signals in a sequential order according to the pipeline containing the sample-and-hold circuits.

7. The memory of claim 4, wherein:
    the first voltage is applied to the selected row line to change a threshold voltage in a selected memory coupled to the selected row line; and
    the second voltage is applied to the selected row line to test whether the threshold voltage in the selected memory has reached a target.

8. The memory of claim 1, wherein each memory cell stores a multi-bit digital value.

9. The memory of claim 8, wherein the data signal input to the voltage generator is a multi-bit digital signal indicating a value to be written in one of the memory cells.

10. The memory of claim 1, wherein each memory cell stores an analog value.

11. The memory of claim 10, wherein the data signal input to the voltage generator is an analog signal indicating a value to be written in one of the memory cells.

12. The memory of claim 1, further comprising a voltage ramp circuit coupled to apply to the select circuits in the pipelines a read signal having a voltage that moves across a voltage range, wherein during a read operation in a pipeline, the select circuit in the pipeline selects the read signal, and the row decoder applies the read signal to the selected row line.

13. The memory of claim 12, wherein:
    the voltage ramp circuit is coupled to the first sample-and-hold circuit in each pipeline;
    each pipeline further comprises a sense amplifier coupled to the array and to the first sample-and-hold circuit; and
    during a read operation in a pipeline, the sense amplifier in the pipeline causes the first sample-and-hold circuit to sample the read signal upon sensing a transition in conductivity of a memory cell being read.

14. The memory of claim 13, further comprising a timing circuit which starts read operations in at least some of the pipelines in parallel.

15. The memory of claim 13, further comprising a timing circuit which sequentially starts read operations in the pipelines.

16. A memory comprising:
    a plurality of pipelines, wherein each pipeline comprises:
        an array of non-volatile memory cells;
        a row decoder coupled to row lines in the array;
        a column decoder coupled to column lines in the array;
        a first sample-and-hold circuit; and a sense amplifier that during a read operation is coupled through the column decoder to a select row line on which a selected memory cell resides, and coupled to a clock terminal of the first sample-and-hold circuit; and a voltage ramp circuit that during the read operation is coupled to apply to the row decoders in the pipelines a read signal having a voltage that moves across a voltage range, wherein during the read operation, the row decoder applies the read signal to the selected row line, and the sense amplifier clocks the first sample and hold circuit in response to sensing a transition in conductivity of the selected memory cell.

17. The memory of claim 16, wherein during the read operation, the voltage ramp circuit is coupled to apply the read signal to an input terminal of the sample-and-hold circuit so that when the sense amplifier clocks the first sample-and-hold circuit, the first sample-and-hold circuit samples the read signal.

18. The memory of claim 17, wherein each memory cell stores a multi-bit digital value.

19. The memory of claim 18, further comprising an analog-to-digital converter coupled convert an analog signal from the sample-and-hold circuits to a multi-bit digital signal.

20. The memory of claim 16, further comprising a timing circuit which starts read operations in at least some of the pipelines in parallel.

21. The memory of claim 16, further comprising a timing circuit which sequentially starts read operations in the pipelines.

22. The memory of claim 16, wherein each memory cell stores a multi-bit digital value.

23. The memory of claim 16, wherein each memory cell stores an analog value.

24. The memory of claim 16, wherein each pipeline further comprises:

a second sample-and-hold circuit;

a multiplexer having input terminals coupled to output terminals of the first and second sample-and-hold circuits; and a selection circuit coupled to select whether the sense amplifier clocks the first sample-and-hold circuit or the second sample-and-hold circuit samples when the sense amplifier senses a transition in the conductivity of the selected memory cell.

25. The memory of claim 24, wherein:

the multiplexer provides an output signal from the first sample-and-hold circuit when the selection circuit selects that the sense amplifier clocks the second sample-and-hold circuit samples; and the multiplexer provides an output signal from the second sample-and-hold circuit when the selection circuit selects that the sense amplifier clocks the first sample-and-hold circuit samples.

* * * * *